US012795849B2

(12) United States Patent
Hsieh et al.

(10) Patent No.: US 12,795,849 B2
(45) Date of Patent: Nov. 10, 2026

(54) FRONT MOUNTED OCP STORAGE CONTROLLER MODULE WITH INTEGRATED BACKUP POWER

(71) Applicant: HEWLETT PACKARD ENTERPRISE DEVELOPMENT LP, Spring, TX (US)

(72) Inventors: Chiung Chao Hsieh, New Taipei City (TW); Chih-Wei Chiang, Taoyuan City (TW); Chui Ching Chiu, Taoyuan City (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 142 days.

(21) Appl. No.: 18/662,327

(22) Filed: May 13, 2024

(65) Prior Publication Data

US 2025/0351288 A1 Nov. 13, 2025

(51) Int. Cl.

| | |
|---|---|
| ***H05K 7/14*** | (2006.01) |
| ***H01M 10/42*** | (2006.01) |
| ***H01M 50/213*** | (2021.01) |
| ***H01M 50/251*** | (2021.01) |
| ***H01M 50/284*** | (2021.01) |
| ***H05K 1/18*** | (2006.01) |
| *H01R 43/20* | (2006.01) |

(52) U.S. Cl.

CPC ........ *H05K 7/1487* (2013.01); *H01M 10/425* (2013.01); *H01M 50/213* (2021.01); *H01M 50/251* (2021.01); *H01M 50/284* (2021.01); *H05K 1/18* (2013.01); *H05K 7/1489* (2013.01); *H01M 2010/4271* (2013.01); *H01M 2220/10* (2013.01); *H01R 43/205* (2013.01); *H05K 2201/10037* (2013.01)

(58) Field of Classification Search

CPC ............................ H01M 50/251; H01K 7/487

See application file for complete search history.

(56) References Cited

U.S. PATENT DOCUMENTS 3,951,185 A * 4/1976 Bower ...................... B08B 9/08 141/378

OTHER PUBLICATIONS

Broadcom, “CacheVault Technology,” Jan. 19, 2021, Product Brief, https://docs.broadcom.com/doc/BC-0497EN, 3 pages.

(Continued)

*Primary Examiner* — Phuong K Dinh

(74) *Attorney, Agent, or Firm* — Jones Burke, PLLC

(57) ABSTRACT

A server system includes a chassis, a primary system board, and a front drive cage. The front drive cage includes a plurality of front bays. An open compute project (OCP) storage controller module is installable within a given front bay of the plurality of front bays. The OCP storage controller module includes an OCP form factor PCB including an OCP edge connector formed in an edge therein. The OCP edge connector mates mated with an OCP connector disposed in the given front bay sch that the OCP storage controller module is electrically connected to a primary system board. Storage controller circuitry is mounted to and/or formed in the PCB, and an energy storage device is mounted to the PCB. The energy storage device comprises a housing and a battery contained in the housing and electrically connected to the storage controller circuitry.

16 Claims, 10 Drawing Sheets

(56) References Cited

OTHER PUBLICATIONS

Broadcom, "CVPM02, CVPM05 Power Modules | CVFM04 Cache Module," Jun. 8, 2021, User Guide Version 1.1, https://docs.broadcom.com/doc/CVPM02-05-CVFM04-UG.
Intel Corporation, "Intel RAID Smart Battery AXXRSBBU8 User's Guide," 2011, Intel Order No. G15580-003, 36 pages, https://www.intel.com/content/dam/support/us/en/documents/motherboards/server/sb/g155.
LSI Corporation, "MegaRAID iBBU05 LiON Battery Backup Unit," Jul. 2008, Quick Installation Guide, 37859-00, Rev. B, https://docs.broadcom.com/doc/12352377, 4 pages.

* cited by examiner

FRONT MOUNTED OCP STORAGE CONTROLLER MODULE WITH INTEGRATED BACKUP POWER

INTRODUCTION

Computing devices (e.g., servers) are sometimes provided with a short term backup power system, such as a battery, to provide short-term power to the device in the event that the main power source fails. This short term backup power system may be in addition to more long-term backup power solutions, such as backup generators designed to power an entire data center. The more long-term backup solutions may not be able to react quickly to a power loss, whereas the local power system may have the ability to react quickly. Thus, a short term backup power system may be included so as to avoid the loss of data which, at the time of the power outage, has not been stored in persistent storage (i.e., a storage medium which retains stored data even after power is removed, such as hard disk drives, flash drives, or other solid state drives), and which may be lost by the time the long-term, facility-wide backup system comes online. One example of data which may be susceptible to loss in the event of a power outage is data being processed by a storage controller prior to being committed to persistent storage media, such as data in the controller's cache. The short term backup system may be designed either to keep the system powered on until the longer-term backup system is ready or to merely keep the system on long enough for it to perform a graceful shutdown, which may including saving transient data to persistent media.

BRIEF DESCRIPTION OF THE DRAWINGS

The present disclosure can be understood from the following detailed description, either alone or together with the accompanying drawings. The drawings and related description of the figures are included to provide a further understanding of the present disclosure and are incorporated in and constitute a part of this specification. The drawings illustrate one or more nonlimiting aspects and implementations of the present teachings and together with the description explain certain principles and operation. In the drawings.

DETAILED DESCRIPTION

Figure 1:
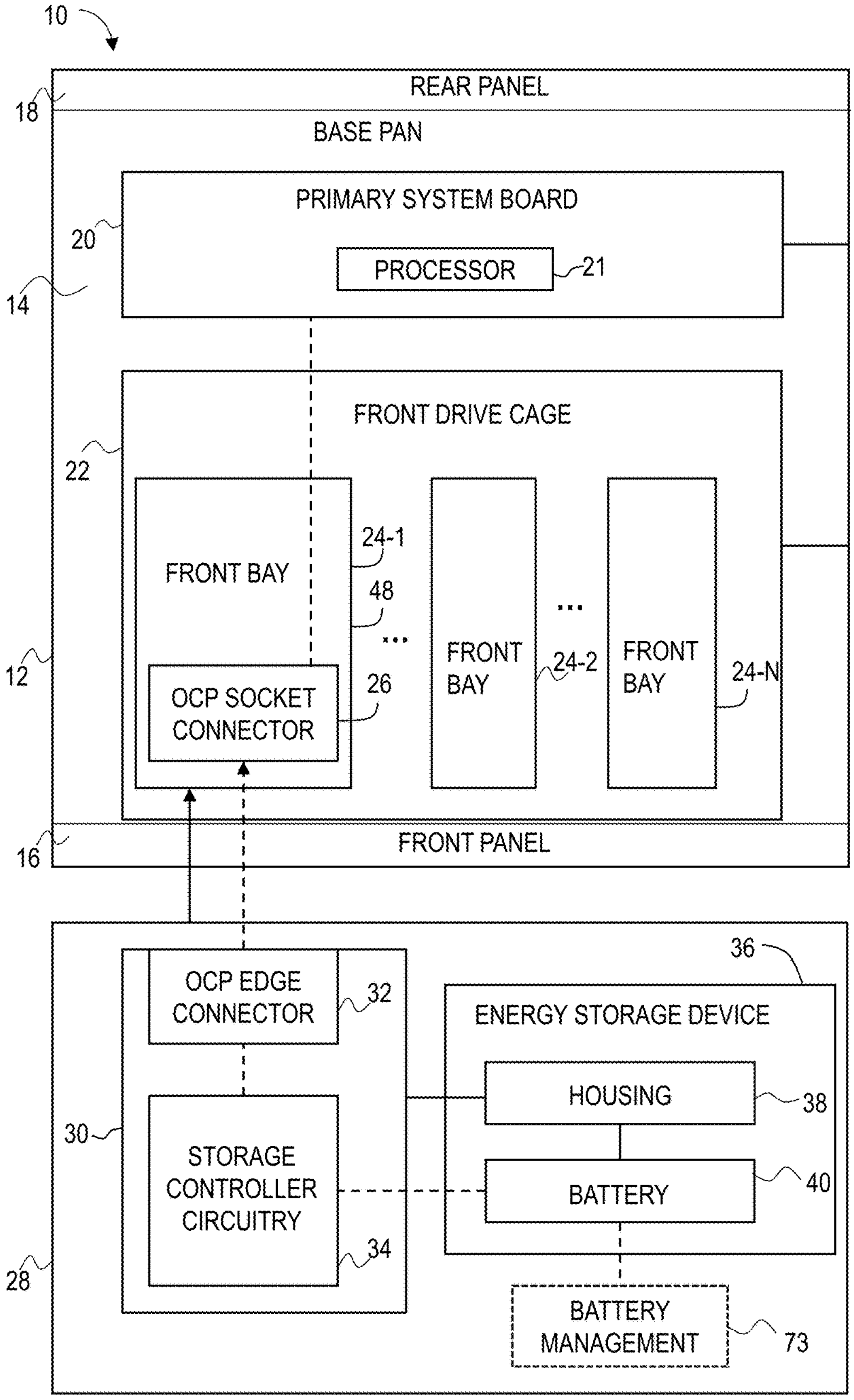
FIG. 1 is a block diagram showing an example of a server system including a front mounted OCP storage controller module consistent with the present disclosure.

Generally, short term backup power systems are provided at the server level, meaning that the battery or other energy storage device is expected to provide backup power for multiple components of the server (and in some cases, the entire server) for a period of time. However, because they power many components, such server-level energy storage devices are often bulky, thus taking up a significant amount of space in the server. Servers are often very space constrained even without a backup energy storage device, and the addition of a server-level energy storage device exacerbates this. Given the space constraints and the size of the backup energy storage device, tradeoffs may need to be made, which often results in the backup energy storage device being relegated to thermally suboptimal (i.e., hot) positions in the server, such as a position which receives less airflow or which receives air that has been pre-heated by upstream components. For example, the backup energy storage device is often positioned in a middle region of the server adjacent an edge of the motherboard. However, energy storage devices are temperature sensitive; as a result, these hot positions in the server can negatively affect the energy storage device and its functionality.

To address the issues noted above, the present disclosure integrates an energy storage device with a storage controller into a pluggable module that is installed, or able to be installed, at the front of a server. This controller/backup module may be installed within a front bay of a set of front bays in a drive cage. The energy storage device is local to the storage controller, meaning that the energy storage device is managed by the storage controller and is responsible for supplying backup power to just the storage controller and not to other components in the server. In other words, each storage controller may have its own, individual, energy storage device, which is packaged together with the storage controller in the same removable module. In addition, each storage controller is able to manage and control its energy storage device independently of other components in the system.

Because the energy storage device only needs to provide backup power to its corresponding storage controller, the energy storage device can be made relatively small. As a result, both the energy storage device and the storage controller can fit within a relatively small module, such as a module having an OCP-NIC 3.0 form factor. Moreover, in some cases, a server-level battery backup can be made smaller because it no longer needs to provide power to the storage controller. This can reduce the cost of a server-level battery, as well as allow it to take up less valuable space in the system and/or allow it to be relocated to a more convenient location within the system. Alternatively, in some cases, the server-level backup power system may be omitted entirely, even further reducing costs and saving valuable space.

Furthermore, because the storage controller and energy storage device are packaged together in the same module, it can allow for easier and more cost-effective manufacture and/or upgrading of systems. Systems may vary in terms of which components, and how many of each, they include, which means that they may have different backup power needs. Thus, if using a server-level backup power approach, one might try to design different server-level backup power systems for each different system configuration. However, this can increase manufacturing costs and complexity, as well as proliferate SKUs. Alternatively, one might try to use a single backup power system for all configurations, but in that case, the system may need to be powerful enough to handle a worst-case scenario, resulting in the system being oversized (and thus inefficient in terms of cost and space) for other configurations. In contrast, the controller/backup modules disclosed herein can allow for a more modular approach in which backup energy storage capacity scales together with the demand for it. For example, as more storage controllers are added to a system, they automatically bring with them their own integrated backup energy. Thus, the amount of backup energy capacity which is provisioned always matches the need, avoiding wasteful overprovisioning.

Moreover, because the controller/backup module is configured to be installed in the front of the system, the position of the energy storage device may be superior to the positions in which energy storage devices are often disposed. In many systems, air flows through the system from front to back. As the air flows through the system, its temperature rises due to absorbing heat from the components it passes. Therefore, the temperature at the front of the server is usually lower than at the rear. Thus, a backup energy device arranged at the front of the server will receive cooler air and thus be cooled better than if it were included in the middle or the rear of the server (as is often the case for the backup energy devices). Moreover, because the backup energy device is integrated into the same module package as the storage controller, the backup energy device is not taking up valuable front bays of the server. A server generally comprises a limited number of front bays, which are usually reserved for pluggable modules which need to be accessible to the user. An energy storage device alone would therefore usually not be permitted to take up one of these valuable bays. However, in the case of the controller/backup modules disclosed herein, the backup energy device is integrated into the same module as the storage controller. Since the storage controller would occupy a front bay regardless, the addition of the backup energy device does not take up any more of the valuable front bays. Moreover, because the energy storage device is integrated into the storage controller and thus is located in a front bay, the energy storage device is made more easily accessible for needed maintenance or replacement of components.

FIG. 1 is a block diagram showing an example of a server system 10 including a front mounted OCP storage controller module 28 consistent with the present disclosure. It should be understood that FIG. 1 is not intended to illustrate specific shapes, dimensions, or other structural details accurately or to scale, and that implementations of the server system 10 including a front mounted OCP storage controller module 28 may have different numbers and arrangements of the illustrated components and may also include other parts that are not illustrated. In FIG. 1, physical connections (e.g., physical attachment and/or support) between components are indicated conceptually by solid lines extending between the components, whereas electrical connections between components are indicated conceptually by dashed lines extending between the components. Furthermore, connections which may be intermittent or conditional (e.g., occurring in some states but not in others) are indicated by arrows. The OCP storage controller module 28 is illustrated in FIG. 1 in the context of the server system 10 to aid understanding, but OCP storage controller module 28 comprise the OCP storage controller module 28 alone and other examples comprise the server system 10 with the OCP storage controller module 28 installed therein.

System 10 may include a chassis 12, which may include a base pan 14, a front panel 16 disposed at an edge of the base pan 14, and a rear panel 18 disposed at an edge of the base pan 14 opposite the front panel 16. Front panel 16 and rear panel 18 may be perpendicular to the base pan 14 and parallel to one another. Chassis 12 may also include two side walls (not illustrated) which extend between the front and rear panels 16 and 18 at two lateral edges of the base pan. The side walls may be perpendicular to the base pan 14 and the front and rear panels 16 and 18. The chassis 12 may also include a cover/lid which is parallel to the base pan 14. The base pan 14, side walls, and cover may be formed, for example, from sheet metal. The front panel 16 and rear panel 18, on the other hand, are not necessarily solid panels, but may rather include various apertures, such as airflow opens through which air may flow, connector opening in which connectors may be disposed, bays in which pluggable modules may be installed/removed, etc. The front and rear panels 16 and 18 may thus be formed from a variety of structures, such as brackets, drive cages, perforated or mesh panels, etc., which are connected to one another and to the rest of the chassis 12 to collectively form a face of the system 10. In some examples, the front panel 16 and the rear panel 18 may be integrally formed with the base pan 14 and extend upwardly from the base pan 14. In other examples, the front panel 16 and the rear panel 18 may be formed separately and coupled to the base pan 14 by, for example, welding, adhesive, or any other suitable connection means.

A primary system board 20 may be supported by the base pan 14. The primary system board 20 includes a processor 21 and may have additional components coupled thereto, which are familiar to those or ordinary skill in the art and thus are not described in detail herein. The primary system board 20 may be a motherboard, aa host processor module (HPM) board, or any other suitable board.

The system 10 may further include a front drive cage 22. As used herein, a drive cage refers to a box-like support structure with multiple front pluggable module bays, such as front drive bays 24-1, 24-2, 24-N (collectively drive bays 24) and front OCP bay(s) 48 defined therein (collectively, front bays 24 and 48). Drive cage 22 may form part of the chassis 12 and may be part of the front panel 16. In other words, front panel 16 may form part of drive cage 22. The front bays 24 and 48 comprise predefined volumes (spaces) within the drive cage 22 which are sized and shaped to receive pluggable modules (e.g., storage drive or other module) having form factors compatible with the bays 24 or 48, respectively. The front bays 24 and 48 also comprise the structures which define the aforementioned volumes, which may include walls of the drive cage 22 and engagement features of the drive cage 22.

Specifically, the front drive bays 24 may be configured to receive storage drives of a particular storage drive form factor, such as EDSFF, SFF, or other storage drive form factor. The drive cage 22 may include, for each drive bay 24, a set of engagement features, such as engagement features 50, shown in FIG. 2 and described in greater detail below, which engage with a drive as the drive is inserted into the bay 24. The engagement features guide the drive into the correct installation position and physically support the drive when installed. Each drive bay 24 is also provided with a corresponding electrical connector which is positioned in the bay such that, when the drive is inserted into the bay 24, the engagement features guide the drive into blind mating with the electrical connector of the bay 24. The electrical connector may be complementary to a connector of the type of drive which the bay 24 is designed to receive. In some examples, some of the electrical connectors may be attached to a backplane, which comprises a printed circuit board assembly (PCA) which is electrically connected to a primary system board of the server such that the installed drives are electrically connected to the primary system board 20 via the backplane.

The OCP bays 48 is to receive an OCP module (a module having an OCP form factor), such as module 28 described below. Similar to the drive bays 24, the OCP bays 48 may comprise engagement features and electrical connectors. However, in some examples, an OCP bay 48 may be formed from one or more of the drive bays 24, in which case the engagement features of the OCP bay 48 may be the same as the engagement feature of the drive bays 24, meaning that the engagement features are designed for use with a storage drive form factor, rather than with an OCP form factor. Thus, in such examples, to enable the OCP bay 48 to receive an OCP module, a special adapter may be attached to the OCP module, forming an assembly which has features that are compatible with the engagement features of the OCP bay 48. Examples of such adapter are disclosed in U.S. patent application Ser. No. 18/628,888, titled "ADAPTER FOR OCP MODULE", the entire contents of which are herein incorporated by reference. Moreover, to enable electrical connection to an OCP module installed in the OCB bay 48, an OCP socket connector 26 is disposed at/in the OCP bay 48. The OCP socket connector 26 is designed to receive an OCP edge connector of an OCP module (such as OCP edge connector 32 described below). An OCP socket connector, as used herein, is a socket-type connector complying with an OCP specification and used for receiving an OCP edge-type connector, such as OCP 4C or 4C+ connectors, to connect OCP external components and devices. Only one OCP socket connector 26 is illustrated in FIG. 1, but any number of such OCP socket connectors 26 may be included (e.g., one per OCP bay 48). The OCP bay OCP connectors 26 may be electrically connected to the primary system board. In some examples, the electrical connector 26 may be part of a cable and may be attached to and supported by a support structure, which may also be referred to as a cable backplane but which may differ from other backplanes in that it may lack a PCB or internal circuitry. Thus, by using the adapter and providing the OCP connector 26, one or more drive bay 24 of a drive cage 22 can be repurposed for use as an OCP bay 48. In other examples, the OCP bay 48 may be natively designed for OCP modules, in which case the engagement features of the OCP bay 48 may be configured to engage with engagement features of the OCP module, rather than with a storage drive. (In FIG. 1, the OCP bay 48 is also labeled as a drive bay 24-1 to indicate that it may, in some examples, be formed from one or more drive bays 24, but this is not intended to be limiting).

Returning to FIG. 1, system 10 further includes an OCP storage controller module 28, which is a pluggable module that may be installed within a given front OCP bay 48. OCP storage controller module 28 includes a printed circuit board (PCB) 30. An OCP edge connector 32 may be formed in one edge of the PCB 30. The OCP edge connector 32 may mate with the OCP socket connector 26 when OCP storage controller module 28 is mounted within a front OCP bay 48 of the drive cage 22. Thus, when OCP storage controller module 28 is mounted within a front OCP bay 48, the OCP storage controller module 28 may be electrically connected to the primary system board 20 via the connection between the OCP edge connector 32 and the OCP socket connector 26. The OCP edge connector 32 may be, for example, an OCP 4C or 4C+ connector. The PCB 30 may have an OCP form factor, meaning its dimensions and other features comply with an OCP form factor specification, such as an OCP NIC 3.0 form factor. Moreover, lateral edges of the PCB 30 may form engagement features of the module 28 which are to engage with complementary engagement features of a native OCP bay when the module 28 is inserted therein. In examples in which module 28 is to be installed in an OCP bay which is not natively configured to receive OCP module, the lateral edges of the PCB may engage with an adapter to precisely position the module 28 relative to the adapter, which in turn engages with the engagement feature of the bay.

PCB 30 may include storage controller circuitry 34 mounted thereon and/or formed therein. As used herein, storage controller circuitry refers to circuitry designed to control a storage array, and may include an integrated circuit (e.g., microcontroller, Application Specific Integrated Circuit (ASIC), Field Programmable Gate Array (FPGA), Complex Programmable Logic Device (CPLD), etc.) which is formed separately from the PCB 30 and then mounted (e.g., soldered) thereto, circuitry formed internal to the PCB 30, and/or other discrete electrical components mounted to the PCB 30. In some examples, storage controller circuitry may include a processor and cache memory. When storage controller circuitry receives a request from a server system to write data, the storage controller circuitry determines where the data is to be allocate and stores the data, while when storage controller circuitry receives a request from a server system to read data, the storage controller circuitry locates, reads, and transfers the data. Storage controller circuitry 34 may perform operations including, but not limited to, the above operations for OCP storage controller module 28.

OCP storage controller module 28 may further include an energy storage device 36. As described previously, an energy storage device refers to a source of backup power for a system component. In system 10, energy storage device 36 may provide backup power for OCP storage controller module 28. Energy storage device 36 may be comprised of a housing 38 and a battery 40. The housing 38 may be physically coupled to PCB 30 such that energy storage device 36 is integrated with the OCP storage controller module 28.

A battery 40 may be received within housing 38. In some examples, battery 40 may be a lithium-ion cell battery, while in other examples, battery 40 may be a lithium-ion hybrid capacitor. Examples are not so limited, however, and other forms of battery may be used. In some examples, the battery 40 may be electrically connected to the storage controller circuitry 34 to provide electrical power thereto.

The OCP storage controller module 28 also comprises battery management logic 73, which controls the charging and discharging of the battery 40. In some examples, the battery management logic 73 is part of the storage controller circuitry 34, meaning that storage controller circuitry 34 may control the energy storage device 36. In other examples, the battery management logic 73 is part of a device separate from the storage controller circuitry 34 (e.g., a separate integrated circuit) which is included in the module 28; for example, energy storage device 36 may include a battery management system (BMS) integrated circuit which acts as the battery management logic 73. Because the battery management logic 73 can be provided in a variety of locations in module 28, it is illustrated in dashed lines in FIG. 1. In some examples, the energy storage device 36 may be controlled independently of the primary system board 20. That is, OCP storage controller module 28 may control its own local energy storage device 36 (via battery management logic 73) and the energy storage device 36 may provide backup power only to its associated OCP storage controller module 28. Note that controlling the energy storage device 36 "independently" from the primary system board means the energy storage device 36 can control charging and discharging itself and the primary system board does not directly perform these functions, but it does not necessarily imply that there is no interaction with or dependency on the primary system board. For example, the primary system board 20 may provide the input power to the module 28 which is used to charge the energy storage device 36. Moreover, the primary system board 20 may also communicate status information with the energy storage device 36, which the energy storage device 36 may rely on for determining whether backup power is needed, for example. The primary system board 20 may also perform authentication on the energy storage device 36.

Figure 2:
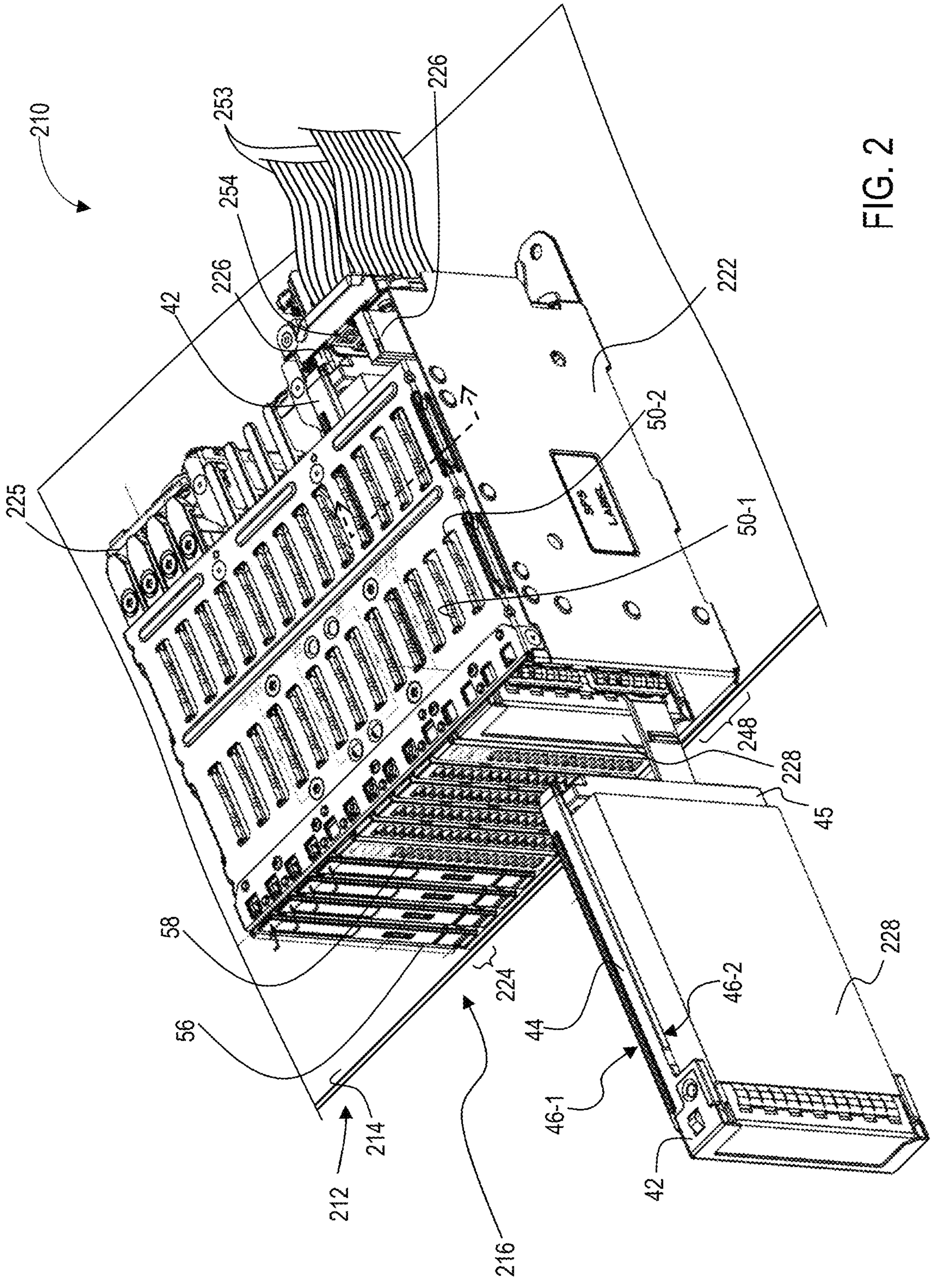
FIG. 2 is an example of a portion of a server system including front drive cage and a front mounted OCP storage controller module consistent with the present disclosure.
Figure 3:
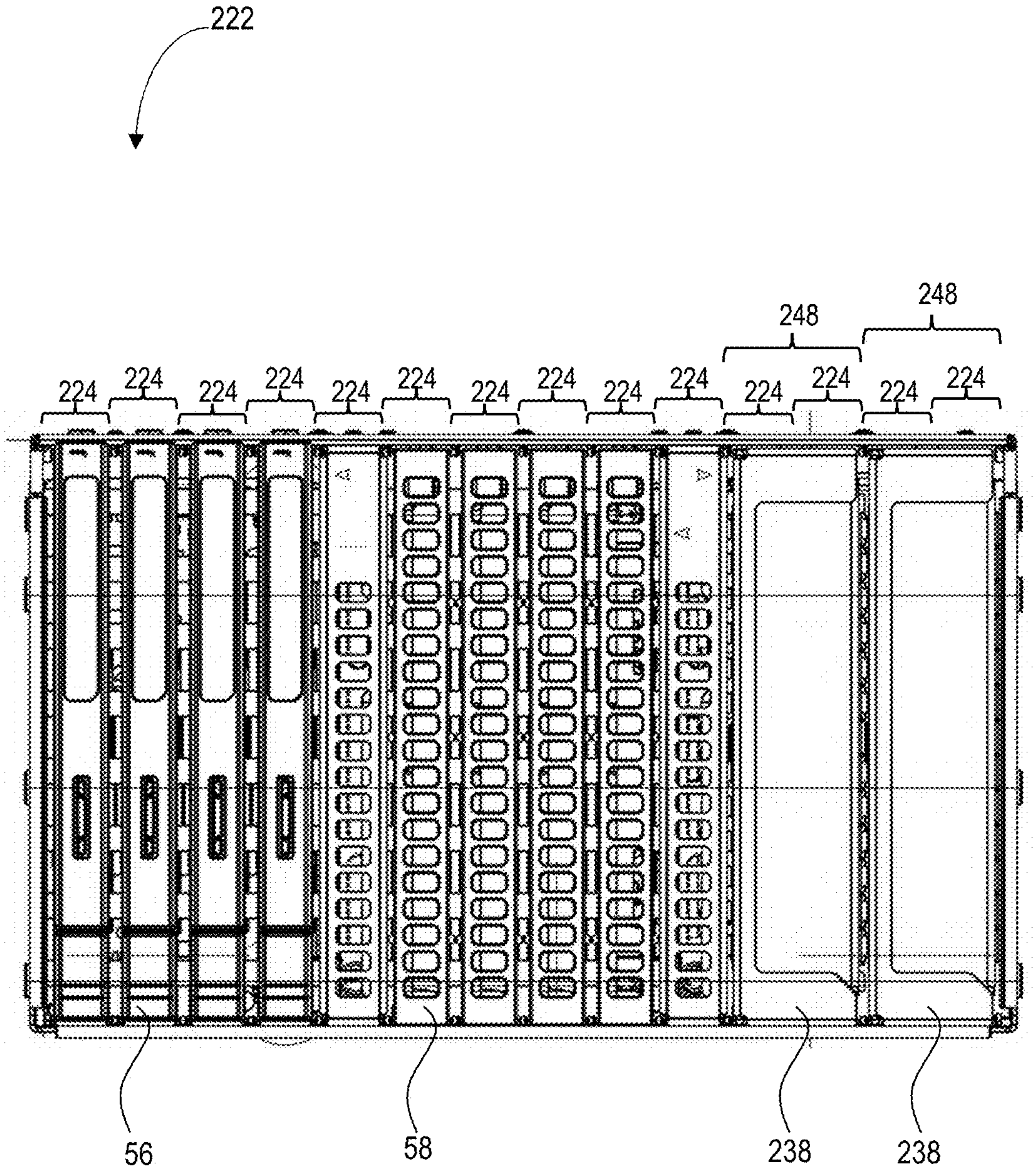
FIG. 3 is a front view of the front drive cage of the system of FIG. 2 including a front mounted OCP storage controller module consistent with the present disclosure.
Figure 4:
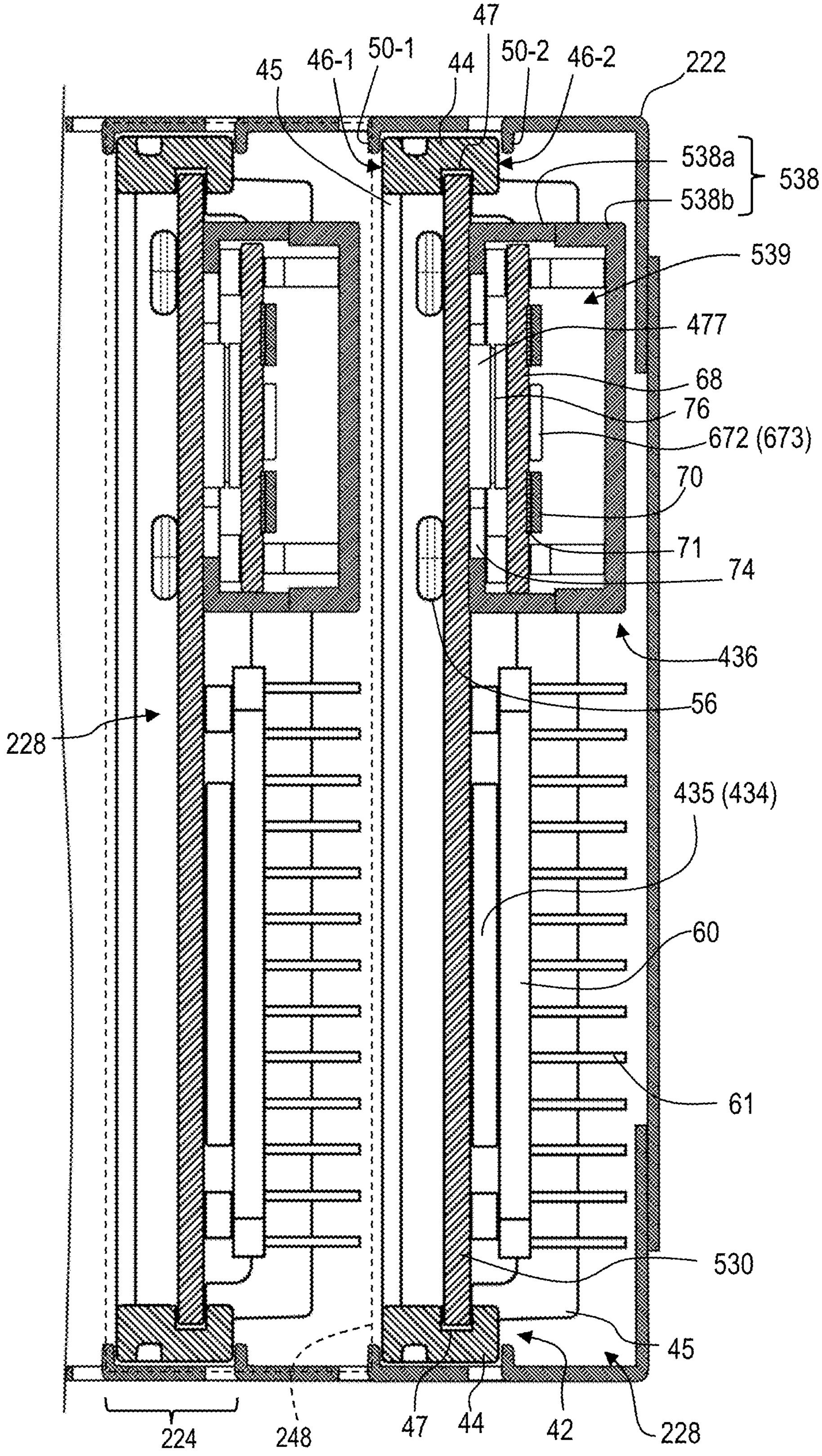
FIG. 4 is a cross-sectional view of a portion of the drive cage of FIG. 3 showing the OCP storage controller module as installed.
Figure 5:
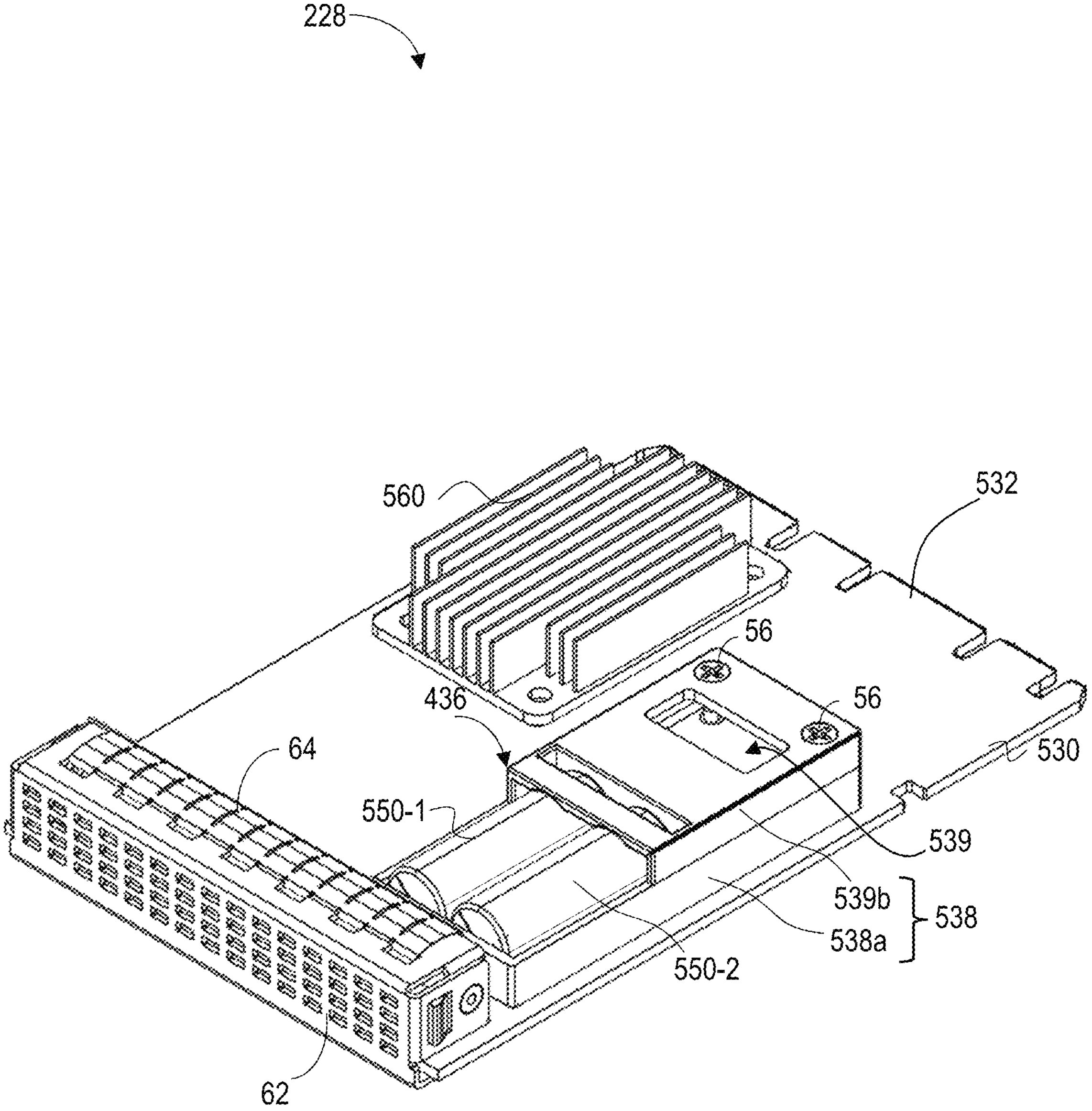
FIG. 5 is a perspective view of an OCP storage controller module including an energy storage device consistent with the present disclosure.
Figure 6:
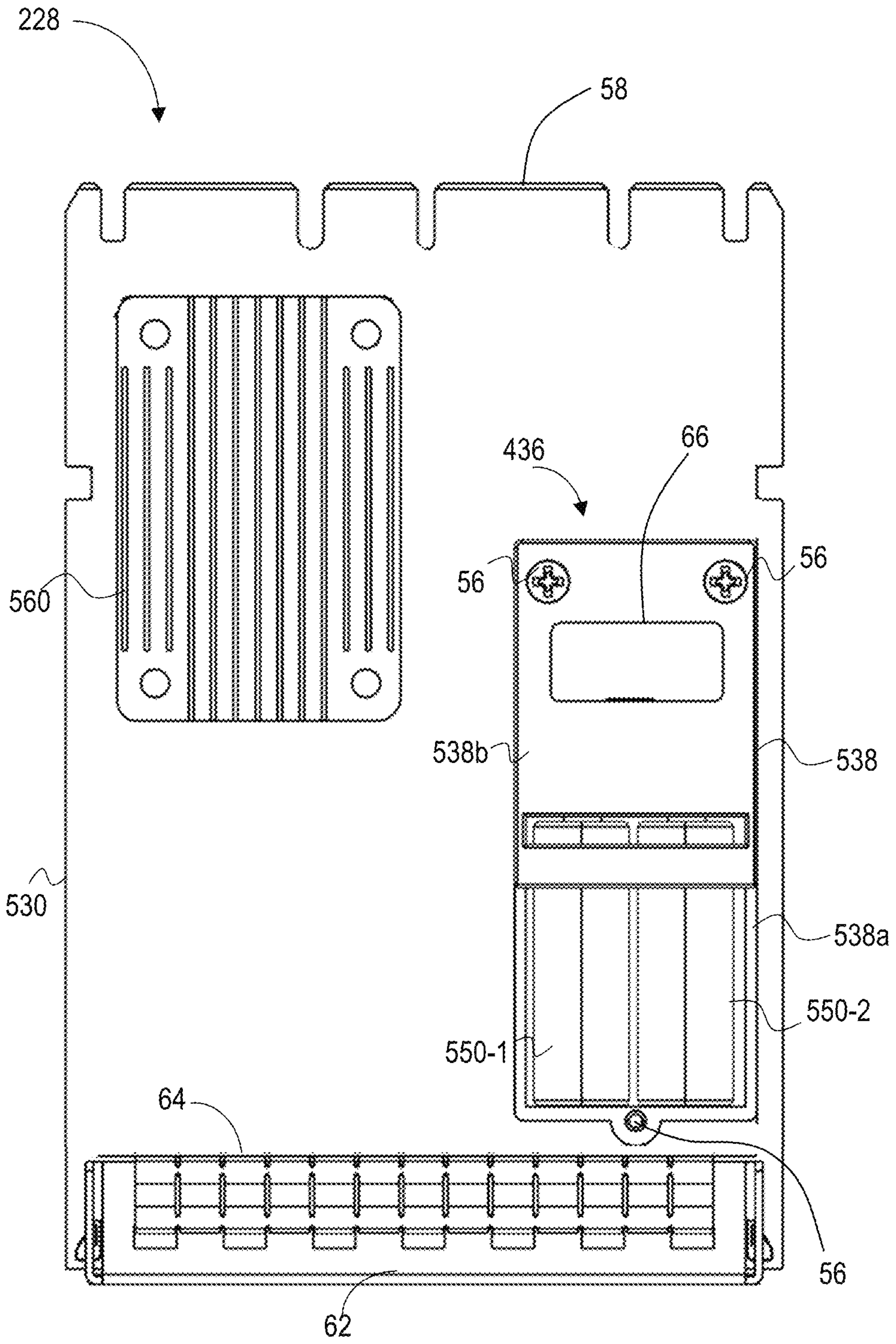
FIG. 6 is a top view of the OCP storage controller module of FIG. 5.
Figure 7A:
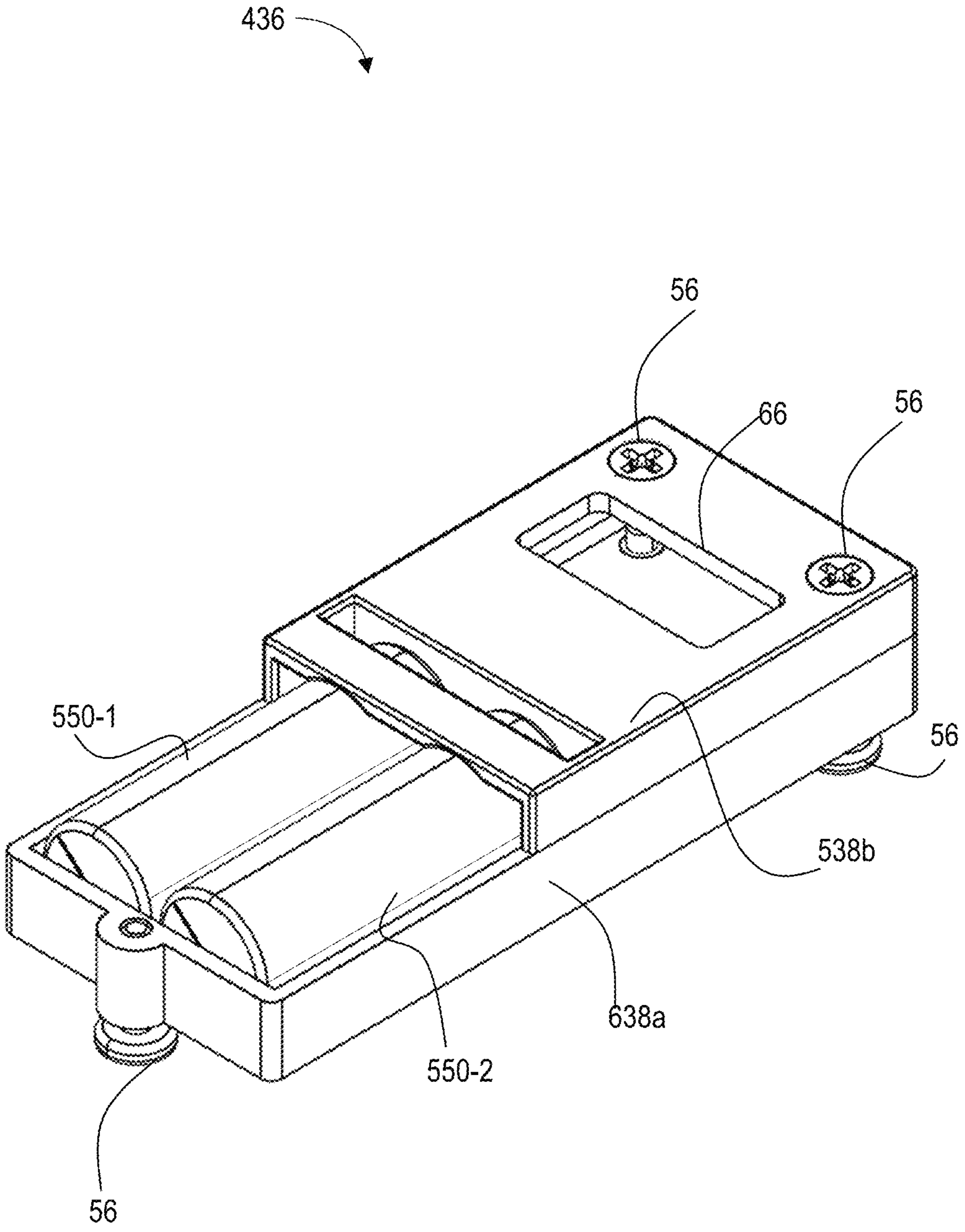
FIG. 7A is a perspective view energy storage device for a front mounted storage OCP controller module consistent with the present disclosure.
Figure 7B:
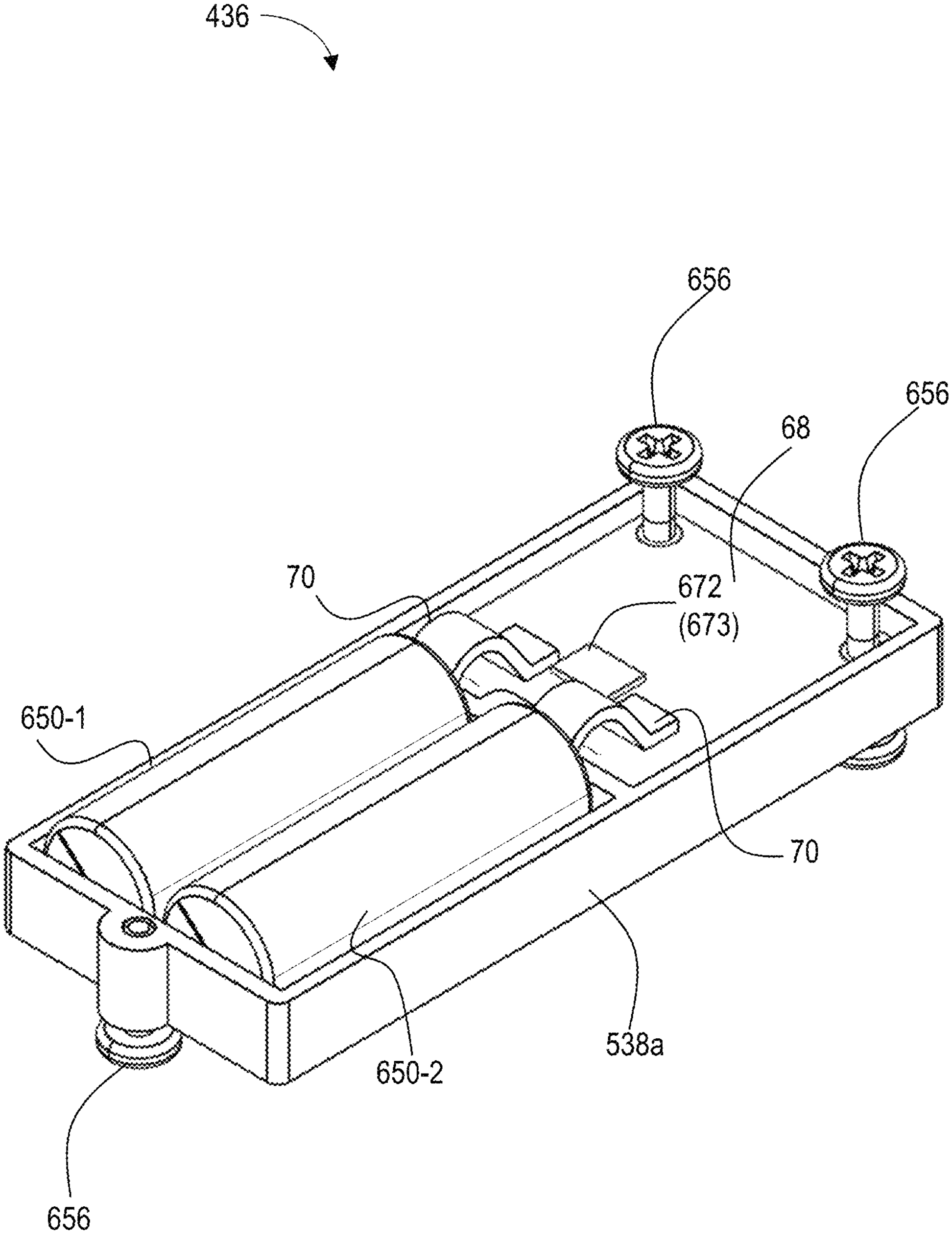
FIG. 7B is the energy storage device of FIG. 6B with a portion of the housing removed.
Figure 7C:
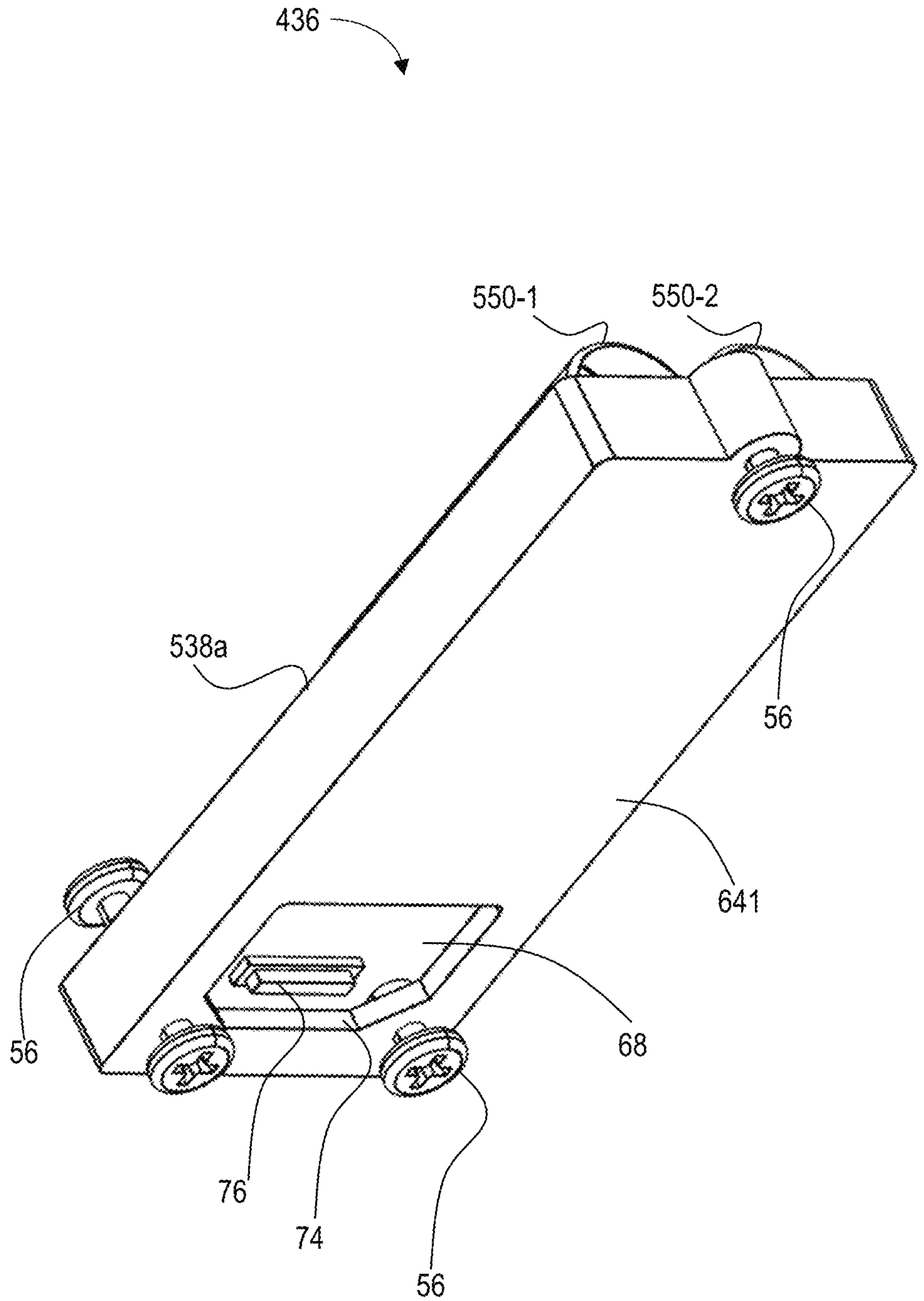
FIG. 7C is a bottom perspective view of the energy storage device of FIGS. 6A and 6B.

Turning now to FIGS. 2-7C, an example OCP storage controller module 228 and an example energy storage device 236 thereof will be described, together with an example of a server system 210 including the front mounted OCP storage controller module 228 consistent with the present disclosure. System 210 may be one implementation example of system 100 shown in and described with respect to FIG. 1, OCP storage controller module 228 may be one implementation example of OCP storage controller module 28 shown in and described with respect to FIG. 1, and energy storage device 228 may be one implementation example of energy storage device 28 shown in and described with respect to FIG. 1. FIG. 2 shows the system 210 with two of the OCP storage controller modules 228, with one in an installed state and one in an uninstalled state. FIGS. 3 and 4 show a drive cage 223 of system 210 (or a portion thereof) with the two OCP storage controller modules 228 in the installed state. FIGS. 5 and 6 show one of the OCP storage controller modules 228 in isolation. FIGS. 7A-7C show the energy storage device 228 of the OCP storage controller module 228 in isolation.

As shown in FIG. 2, system 210 may include a chassis 212 which includes a basepan 214 front panel 216. Chassis 212 may also include side walls, a rear panel, and cover which are omitted from view. Coupled to, or formed as part of, the chassis 212 is a front drive cage 222. The front drive cage 222 may form part of the front panel 216. The front panel 216 may also include other elements (not illustrated) which are adjacent to the drive cage 222, such as additional drive cages or other module bays, brackets, etc.

As shown in FIGS. 2 and 3, drive cage 222 may include drive bays 224. In this example, drive cage 222 includes multiple drive bays 224, one of which is labeled in FIG. 2. Drive bays 224 may be dimensioned to receive module having a particular form factor or belonging to a particular family of form factor. For example, the drive cage 222, and thus drive bays 224, may be sized to receive Enterprise and Data Center Standard Form Factor (EDSFF) E3.S drives; however, examples are not so limited and the drive cage 222 and drive bay 224 may be designed to receive other types of drives. Some of the drive bays 224 may include electrical connectors (not visible) which are arranged to mate with complementary electrical connections of the drives when the drives are installed in the bays 224. The electrical connectors may be compatible with the form factor of drives the bays 224 are configured to receive and may be mounted to a backplane 225 attached to the rear of the drive cage 222 in alignment with a subset of the bays 224.

Each drive bay 224 includes engagement features 50 to receive and hold a drive when inserted into the drive bay 224. As shown in FIGS. 2 and 4, the engagement features 50 may comprise protrusions which protrude into the interior space of the drive cage 222, with the bays 224 being defined in the space between two adjacent engagement feature 50 (or between an engagement feature 50 and a wall of the drive cage 222). A drive or adapter 42 (described below) having the right form factor fits between two adjacent engagement features 50 when inserted into a bay 224, with the engagement feature 50 engaging with engagement features of the drive or adapter 42 to guide it into an installed position and support it in the installed position. As shown in FIGS. 2 and 4, engagement features 50 may be tabs formed from portions of the top and bottom walls of the drive cage 222 which have been cut and bent (e.g., stamped) so as to extend into drive bay 224 to receive a corresponding feature on a drive. However, examples are not so limited and engagement features 50 may be extrusions or may be formed as a separate component and attached to the drive cage 222 by, for example, welding or adhesive. In FIGS. 2 and 4 multiple engagement features 50 are visible, but only two of the engagement features 50 are labeled to avoid obscuring other aspects, namely engagement features 50-1 and 50-2.

A drive bay 224 of a drive cage 222 is often sized such that either one drive bay 224 receives a single drive of the corresponding form factor or, in some cases, a drive takes up an integer multiple of bays 224. For example, as shown in FIG. 2 and FIG. 3, a drive bay 224 may receive a drive 56. Although only one drive 56 is labeled in FIGS. 2 and 3, multiple drives 56 may be received in drive cage 222, with the limitation on the number of drives 56 being the number of drive bays 224. In addition, a bay filler 58 may be used to occupy drive bays 224 of a drive cage 222 that are not being filled by a drive 56. When a new drive is ready to be added, bay filler 58 may be removed and the new drive may be installed. FIGS. 2 and 3 show vertically oriented drive bays 224 and thus vertically oriented drives 56 and bay fillers 58 (in this context, vertical means an orientation perpendicular to the base pan 214); however, examples are not so limited and other orientations of drive bays 224, and thus drives 56 and bay fillers 58, may be used, such as horizontally oriented drive bays 224.

In addition to the drive bays 224, the drive cage 222 comprises two OCP bays 248, as shown in FIGS. 2-4. In this example, each OCP bays 248 is formed from two adjacent drive bays 224, as shown in FIG. 3. This is because an OCP storage controller module 238 is larger than the drives 56 and will not fit within a single bay 224. Thus, an OCP bay 248 is dimensioned such that it occupies two drive bays 224. This is due to the dimensions of an OCP module, such as OCP storage controller module 228, using the OCP form factor. Furthermore, unlike the other drive bays 224 which may have a storage device connector disposed therein (or no connector at all if not being used), the OCP bays 248 may each have an OCP socket connector 226 disposed therein, as shown in FIG. 2. The OCP socket connector 226 is one example of the OCP socket connector 56 described above. In this example, the OCP socket connector 226 is part of a cable assembly and is connected to a primary system board (not illustrated) via conductors of a cable 253 attached to the connector 226. The connectors 226 are attached to an OCP backplane 254 so that the connectors 226 protrude into the rear of OCP bays 248, as shown in FIG. 2. The OCP backplane 254 is attached to the rear side of the drive cage 222. Thus, when an OCP module such as OCP storage controller module 228 is installed in one of the OCP bays 248, the OCP edge connector of the module may blind mate with the OCP socket connector 226 of the bay 248, thus electrically connecting the module to the primary system board via the cable 253.

In addition, as discussed above, the engagement features of the OCP module are not compatible with the engagement feature 50 of the drive bays 224. For OCP modules (including module 228), the engagement features thereof are the lateral edges of the PCB of the module which are designed to fit within grooves in a rail of an OCP bay. However, the engagement features 50 of the drive cage 222 are spaced much farther apart from one another then the width of the PCB of the OCP module (so as to engage with a drive inserted therebetween), and thus the engagement features 50 will not engage with or properly align the OPC module in the bay 248. As such, an adapter 42 for an OCP module may be installed on the OCP storage controller module 228 to enable it to be installed in the bay 248. As shown in FIG. 2, adapter 42 is installed on the OCP storage controller 228. Example adapters are disclosed in U.S. patent application Ser. No. 18/628,888, titled "ADAPTER FOR OCP MODULE", the contents of which are herein incorporated by reference.

As shown in FIGS. 2 and 4, adapter 42 includes two side rails 44 that extends along substantially the length of OCP storage controller module 238. The adapter 42 also comprises one or more crossmembers 45 which connect the side rails 44 together. In the space between the side rails 44, an OCP module such as the OCP storage controller 228 may be disposed. As shown in FIG. 4, the adapter 42 includes first engagement features 47 and second engagement features 46. The first engagement features 47 comprise grooves or slots on in the side rails 44 which engage with the lateral edges of the PCB of the OPC module (e.g., PCB 230). This engagement supports the PCB 230 relative to the adapter 42 and also aligns the PCB 230 relative to the adapter 42. The second engagement features 46 engage with the engagement features 50 for the drive cage 222 when the assembly of the module 228 and adapter 42 is installed in the drive cage 222. This engagement aligns adapter 42 (and hence also the module 228 attached thereto) relative to the drive cage 222, guides the adapter 42 (and module 228) into an installed position, and supports the adapter 42 (and hence module 228) relative to the drive cage 222.

As shown in FIGS. 2 and 4, the second engagement features 46 include a first engagement surface 46-1 disposed on one side of the side rail 44 and a second engagement surface 46-2 disposed opposite first engagement surface 46-1 (collectively, engagement surfaces 46). In some examples, engagement features 46 may comprise one or more protrusions (e.g., tabs, posts, flanges) that engage with the engagement features 50 of the drive cage 222. However, examples are not so limited, and engagement features 46 may be recesses or another form of engagement feature 46 that is able to engage with engagement features 50 of the drive cage 222. As shown in FIG. 4, engagement features 46 may be part of side rail 44; that is, engagement features 46 may be integrally formed with side rail 44. In other examples, engagement features 46 may be formed separately from side rail 44 and be attached thereto by, for example, adhesive, welding, or another suitable attachment mechanism. The adapter 42 may be attached to the OCP storage controller module 238 by engaging edges of a PCB of the OCP storage controller module 238 with one of engagement surfaces 46.

The engagement features 46 may be dimensioned and shaped to mimic the engagement features of the drive for which the drive cage 222 is dimensioned to receive, such that engagement features 46 are able to engage with engagement features 50 of the drive cage 222 in the same way that a drive such as drive 56 (which is dimensioned to be received in the drive bay 224 without an adapter) engages. In some examples, engagement features 46 of the adapter 42 may slidingly engage with the engagement features 50 of the drive cage, although examples are not so limited. When OCP storage controller module 228 is coupled to an adapter 42 and inserted into drive cage 222, as shown in FIG. 4, the engagement features 46 of the adapter 42 and the engagement features 50 of the drive cage 222 align and guide the OCP storage controller module 228 into proper installation position. As a result, when an OCP storage controller 228 is installed together with an adapter 42, it is received and able to sit in the drive cage 222 just as a drive 56 or a bay filler 58 would, as is shown in FIG. 3. It is to be noted that, while only one OCP storage controller module 228 and associated components are labeled in FIG. 4, each OCP storage controller module 228 includes the same components.

As noted in FIG. 3, OCP storage controller module 228 takes two drive bays 224, such that one OCP bay 248 is made up of two drive bays 224. When the assembly comprising the module 228 with the adapter 42 attached thereto is installed in a given OCP bay 248, the adapter 42 engages with the engagement features 50 in one of the drive bays 224 of the OCP bay 248 and some portions of the OCP storage controller module 228 extend into the second drive bay 224 of the OCP drive bay 248.

The OCP storage controller module 228 and the energy storage device 236 thereof will now be described in greater detail with reference to FIGS. 4-7C. Note that some components of the module 228 are not visible in FIG. 2 because they are blocked from view by an optional cover, but in FIGS. 4-7C this optional cover is omitted.

The OCP storage controller module 228 comprises a PCB 530 (see FIGS. 4-6), storage controller circuitry 434 comprising a storage controller integrated circuit 435 mounted to the PCB 530 (see FIG. 4), a heatsink 560 disposed on the storage controller integrated circuit 435 and attached to the PCB 530 (see FIGS. 4-6), a front plate 62 attached to the PCB 530 (see FIGS. 5-6), an OCP edge connector 532 formed in a rear edge of the PCB 530 (see FIGS. 5-6), and an energy storage device 436 attached to the PCB 530 (see FIGS. 4-6 and 7A-7C). These components will be described in greater detail in turn below.

For example, as shown in FIG. 4, OCP storage controller module 228 includes storage controller circuitry 434. Storage controller circuitry 434 may be an example implementation of storage controller circuitry 34 discussed with respect to FIG. 1. In this example, storage controller circuit 434 includes a storage controller integrated circuit 435 which is mounted (electrically connected and physically attached to) to the PCB 530. In some examples, commercially available storage controllers may be used as the storage controller integrated circuit 435. Storage controller integrated circuits are familiar to those of ordinary skill in the art and thus further details thereof are not described herein. The storage controller circuit 434 may also include additional components not illustrated herein, such as internal circuitry of the PCB 530 (e.g., contact pads, conductive traces), discrete components mounted to the PCB 530 (e.g., capacitors, transistors, etc.) or other components as would be familiar to those of ordinary skill in the art.

A heat sink 60 may be coupled to storage controller circuitry 434. Heat sink 60 receives heat from the storage controller circuitry 434 via conduction and dissipates that heat into the surrounding air. As shown in FIG. 4, heat sink 60 may include portions 61 (e.g., fins) that extend upward away from the storage controller circuitry 434. These extended portions may increase the surface area of the heat sink 60, thus increasing the efficacy of the heat sink 60 in dissipating heat from the storage controller circuitry 434.

In addition, OCP storage controller module 228 includes an energy storage device 436. As discussed with respect to FIG. 1, and discussed further herein, energy storage device 436 includes a housing 538 to receive one or more batteries 550. Energy storage device 436 further includes a mezzanine board 68 coupled to the housing 538 and battery connectors 70 which electrically connect the batteries 550 to the mezzanine board 68, as shown in FIG. 7B. The mezzanine board 68 is then electrically coupled to the PCB 530 of the OCP storage controller module 228 via a connector 76 on a bottom side of PCB 530, shown in FIG. 7C, which mates with a connector 477 of the PCB 530, as shown in FIG. 4. The connector 477 is electrically connected to power supply circuitry of the PCB 530 which supply power to the storage controller circuitry 434. This power supply circuitry of the PCB 530 may include, for example, conductive traces or planes in the PCB 530 which carry a supply potential or a ground potential. This power supply circuitry of the PCB 530 may be connected to pins of the OCP connector 532 which receive power supplied from a primary system board. Thus, the mezzanine board 68 is electrical connected to the PCB 530 via connectors 76 and 477, and can either supply electrical power to the PCB 530 (for powering the storage controller circuitry 434) or can draw electrical power from the PCB 530 (for charging the batteries 550).

The energy storage device 436 also includes battery management circuitry 673 which controls the flow of electrical power between the PCB 530 and the battery 550 or batteries 550 (i.e., controls the charging and discharging of the batteries 550). The battery management circuitry 673 is an example implementation of the battery management circuitry 73 described above. In this implementation, the battery management circuitry 673 is part of the energy storage device 436, and more specifically includes a battery management integrated circuit 672 which is mounted to the mezzanine board 68. The battery management integrated circuitry 672 may include, for example, a commercially available battery management system (BMS) integrated circuit. The battery management circuitry 673 may also include additional components (not illustrated) mounted to the mezzanine board 68, such as transistors, diodes, capacitors, switches, e-fuses, or other power components familiar to those of ordinary skill in the art for delivering power under the control of the battery management integrated circuit 672. The mezzanine board 68 includes connection pads 71 disposed on mezzanine board 68, which are electrically connected (e.g., soldered) to the battery connectors 70, as shown in FIG. 4, which are in turn connected to batteries 550 as shown in FIG. 7B. The connection pads 71 are also electrically connected (or selectively connectable) to the connector 76 via the battery management circuitry 673, thus completing the electrical circuit between the battery 550 and the PCB 530 via mezzanine board 68.

In some examples, the connection pads 71 are selectively electrically connectable to the connector 76 via the battery management circuitry 673, meaning that the battery management circuitry 673 can selectively open or close the electrical circuit between the battery 550 and the PCB 530. When the circuit is closed, power can flow from the battery 550 to the PCB 530 (to power the storage controller circuitry 434 during a power outage) or from the PCB 530 to the batteries 550 (to charge the batteries 550 during normal operation). When the circuit is open the batteries 550 are electrically isolated form the PCB 530.

In some examples, the power supply circuitry of the PCB 530 may include components to prevent back-feeding of power from the PCB 530 to the primary system board, such as diodes or other power gating logic. In other words, in some examples, power may flow from the primary system board into the PCB 530 and into the batteries 550 via the OCP edge connector 532, but power is prevented from following the other direction from the batteries 550 and PCB 530 into the primary system board via the OCP edge connector 532. In this manner, the energy storage device 436 is wholly local to the module 228 in that it provides backup power only the module 228 and its charging and discharging are controlled by the module 228 (i.e., by battery management circuitry 673).

An example of an OCP storage controller module 228 is shown in FIGS. 5 and 6, with FIG. 5 showing a perspective view and FIG. 6 showing a top view. OCP storage controller module 228 may include a PCB 530 to which various components, such as storage controller circuitry 434 and an energy storage device 436 may be coupled. PCB 530 may include an OCP edge connector 532 formed in one edge thereof. As shown in FIGS. 5 and 6, OCP edge connector 532 may be disposed opposite a front plate 62 of OCP storage controller module 228. Although not shown in FIGS. 5 and 6, OCP edge connector 532 includes electric connectors, which mates with an OCP socket connector, such as OCP cable connector 226, shown in FIG. 2.

OCP storage controller module 228 may further include an electromagnetic interference ("EMI") shield 64 formed as part of or coupled to the front plate 62. As used herein, an EMI shield refers to a component configured to contact an EMI shield (or other component with electromagnetic interference shielding capabilities) and to extend the EMI shielding thereof along a given dimension. Generally, information processing devices include an electrically conductive (metal) chassis, such as chassis 12 or chassis 212, which houses and supports the components. One function of the chassis is to reduce the electromagnetic interference (EMI) emitted by the device and/or to reduce the EMI admitted into the device from adjacent EMI sources. However, openings in the chassis, such as the openings in bays through which storage drives or other modules are inserted, can provide a route for EMI to exit and enter the device and thus degrade the EMI shielding provided by the chassis. To avoid this issue, removable modules, including OCP modules, generally include EMI shielding features which comprise electrically conductive elements which physically engage and electrically connect with EMI shielding features of adjacent removable modules and/or EMI shielding features of the drive cage, when the module is installed. Thus, when OCP storage controller module 428 is installed in a drive cage, such as shown in FIGS. 2-4, OCP storage controller module 228 is protected from EMI effects on the components included as part of OCP storage controller module 428. EMI shield 64 is shown as fingers but examples are not so limited. In some examples, front plate 62 and the EMI shield 64 thereof are configured in accordance with specifications of an OCP form factor, and thus may not fill the opening of the OCP bay 248, which is not natively designed to receive OCP modules. Thus, in some examples, adapter 42 may include feature to extend the shielding of the EMI shield 64 to fill the opening of bay 248.

An energy storage device 436 may be coupled to the PCB 530. As discussed with respect to FIG. 1, energy storage device 436 may be removably mounted to PCB 530. This may allow for easy repair or replacement of the energy storage device 436 without necessarily having to discard or replace the entire module 228. This may also allow a user to upgrade the module 228 after manufacture by replacing their current version of energy storage device 436 with another version of energy storage device 436 which may have additional capabilities or capacity. In some examples, the energy storage device 436 may be coupled to the PCB 530 by fasteners 56. Fasteners 56 may be screws, pins, or any other removable fastener. As discussed with respect to FIG. 1, energy storage device 436 may include a housing 538. The housing 538 may include openings for fasteners 56, and fasteners 56 may be received at a corresponding hole or receptacle formed within PCB 530, such that energy storage device 436 is securely coupled to PCB 430 yet is still able to be removed and placed in an alternate location if needed. Housing 538 may include a base **538*a* and a cover 538*b* that covers at least a portion of the base 538*a*. In some examples, cover 538*b* may cover portions of components of energy storage device 436. In particular, in the illustrated example, the base 538*a* and cover 538*b* join together to form a semi-enclosed compartment 539 in which the mezzanine card 68 is disposed. Cover 538*b* may include a window 66 which provides an opening into the compartment 539 which may allow for airflow to cool the mezzanine card 68 and may also allow for access to the mezzanine card 68 for test equipment without necessarily requiring opening of the cover 538*b*. Cover 538*b* may also substantially cover the battery connectors 70, thus protecting users from inadvertent contact with these charged conductors. Cover 538*b* may also extend partially over and contact the batteries 550, thus helping to physically secure the batteries 550 in the housing 538. However, in some examples, housing 538 does not fully cover the batteries 550, thus allowing for a user to remove or install batteries 550 without necessarily having to remove the cover 538*b***.

An example of an energy storage device 436 is shown in FIGS. 7A-7C. Energy storage device 436 may be an example of energy storage device 36 discussed with respect to FIG. 1. As described with respect to FIGS. 5 and 6, energy storage device 436 may include a housing 538 into which one or more batteries 550 may be received. While two batteries 550-1 and 550-2 are shown in FIGS. 7A-7C, examples are not so limited and other numbers of batteries 550 may be used. In addition, while batteries 550 are cylindrical in shape, other shapes or forms of battery may be used.

Mezzanine board 68 further includes a connector 76 disposed on a lower portion thereof. A bottom face 641 of housing 638 includes an opening 74 which provides access to the connector 76. Connector 76 couples with a power connector 477 of the PCB 530 of the OCP storage controller module 228 to provide electrical connection between the energy storage device 436 and the storage controller circuitry. Thus, when connector 76 is coupled to the PCB 530 at the power connector 477, the components of the energy storage device 436 are electorally coupled with the other components of the OCP storage controller module.

Figure 8:
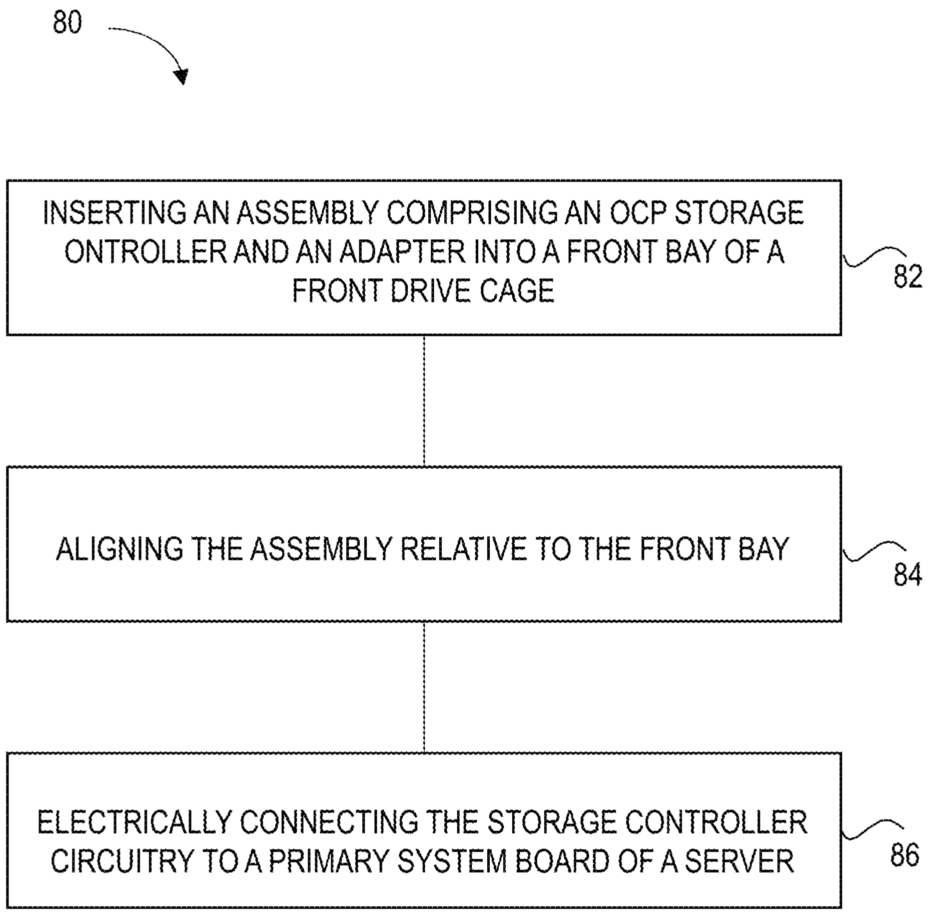
FIG. 8 is process flow diagram illustrating an example method for using a front mounted OCP storage controller module consistent with the present disclosure.

FIG. 8 shows an example method 80 for installing and using a front mounted OCP storage controller module consistent with the present disclosure. At 82, method 80 includes inserting an assembly into a front bay of a front drive cage. The assembly may include an OCP storage controller module, such as OCP storage controller module 228 and/or OCP storage controller module 228, and an adapter 42.

At 84, method 80 may include aligning the assembly relative to the front bay. More particularly, the assembly may be aligned by engaging the adapter with the engagement features of the bay, as discussed with respect to FIGS. 2 and 4. Because the adapter portion of the assembly includes first engagement features (which couple to the OCP storage controller module) and second engagement features, engaging the adapter with the engagement features of the bay may comprise engaging the second engagement features of the adapter with engagement features of the bay.

At 86, method 80 may include electrically connecting the storage controller circuitry to a primary system board of a server. More particularly, the storage controller circuitry may be included on a PCB of OCP storage controller module, as shown and discussed with respect to FIGS. 1 and 5-6. The PCB includes an OCP edge connector which is designed to mate with a corresponding OCP socket connector disposed in the front bay, as discussed with respect to FIG. 2 and FIGS. 5-6. In some examples, the OCP socket connector is coupled to the primary system board by a cable, although examples are not so limited. Once the OCP edge connector and the OCP socket connector are mated, the OCP socket connector is electrically connected with the primary circuit board.

In some examples, prior to inserting the assembly into a front bay of a front drive cage, a battery may be installed in a housing of the energy storage device. As shown in FIGS. 1 and 5-7C, a battery may be electrically connected to storage controller circuitry and, more particularly, may be electrically connected to storage controller circuitry through electrical connection of the battery to a mezzanine board. As described with respect to FIG. 7C, the mezzanine board includes a connector which mates with a power connector of the PCB. The power connector is in turn electrically connected with the storage controller circuitry such that, when the connector of the mezzanine board is mated with the power connector, the storage controller circuitry provides electrical power to the energy storage device.

It is to be understood that both the general description and the detailed description provide example implementations that are explanatory in nature and are intended to provide an understanding of the present disclosure without limiting the scope of the present disclosure. Other examples in accordance with the present disclosure will be apparent to those skilled in the art based on consideration of the disclosure herein. For example, various mechanical, compositional, structural, electronic, and operational changes may be made to the disclosed examples without departing from the scope of this disclosure, including for example the addition, removal, alteration, substitution, or rearrangement of elements of the disclosed examples, as would be apparent to one skilled in the art in consideration of the present disclosure. Moreover, it will be apparent to those skilled in the art that certain features or aspects of the present teachings may be utilized independently (even if they are disclosed together in some examples) or may be utilized together (even if disclosed in separate examples), whenever practical. In some instances, well-known circuits, structures, and techniques have not been shown or described in detail in order not to obscure the examples. Thus, the following claims are intended to be given their fullest breadth, including equivalents, under the applicable law, without being limited to the examples disclosed herein.

References herein to examples, implementations, or other similar references should be understood as referring to prophetic or hypothetical examples, rather than to devices/systems that have been actually produced, unless explicitly indicated otherwise. Similarly, references to qualities or characteristics of examples should be understood as representing the educated estimates or expectations of the inventors based on their understanding of the relevant principles involved, application of theory and/or modeling, and/or past experiences, rather than as being representations of the actual qualities or characteristics of an actually produced device/system or the empirical results of tests actually carried out, unless explicitly indicated otherwise.

Further, spatial, positional, and relational terminology used herein is chosen to aid the reader in understanding examples of the invention but is not intended to limit the invention to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Furthermore, if a different reference frame is considered than the one illustrated in the figures, then the spatial terms used herein may need to be interpreted differently in that different reference frame. Moreover, the poses of items illustrated in the figure are chosen for convenience of illustration and description, but in an implementation in practice the items may be posed differently.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition. Moreover, unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

What is claimed is:

1. A server system, comprising:

a chassis comprising a base pan, a front panel, and a rear panel;

a primary system board supported by the base pan;

a front drive cage including a plurality of front bays to receive a plurality of pluggable modules, wherein the front drive cage forms part of the front panel; and an open compute project (OCP) storage controller module, wherein the OCP storage controller module is a pluggable module installed within a given front bay of the plurality of front bays and comprises:

a printed circuit board (PCB) having an OCP form factor and including an OCP edge connector formed in one edge of the PCB, the OCP edge connector being mated with an OCP socket connector disposed in the given front bay and electrically connected to the primary system board;

storage controller circuitry mounted to and/or formed in the PCB; and an energy storage device mounted to the PCB, wherein the energy storage device comprises:

a housing; and a battery contained in the housing and electrically connected to the storage controller circuitry.

2. The server system of claim 1, wherein the OCP socket connector is electrically connected to the primary system board by a cable.

3. The server system of claim 2, wherein the OCP socket connector is attached to and supported by a backplane panel attached to the chassis and positioned at a rear of the front drive cage.

4. The server system of claim 1, wherein the energy storage device is removably coupled to the PCB.

5. The server system of claim 1, wherein the OCP storage controller module controls the energy storage device.

6. The server system of claim 5, wherein the OCP storage controller module controls the energy storage device independently of the primary system board.

7. The server system of claim 5, wherein the OCP storage controller module comprises battery management circuitry configured to control the battery.

8. The server system of claim 7, wherein the battery management circuitry is mounted to part of the PCB.

9. The server system of claim 7, wherein the energy storage device comprises a mezzanine board attached to the housing and electrically connected to the battery, wherein the mezzanine board comprises:

a connector coupled to a power connector of the PCB to electrically connect the battery to the storage controller circuitry; and the battery management circuitry.

10. The server system of claim 1, wherein:

the energy storage device comprises a mezzanine board;

the housing comprises a battery compartment which holds the battery, a mezzanine board compartment which holds the mezzanine board, and electrical contacts which extend from the battery compartment into the mezzanine board compartment and electrically connect the battery to the mezzanine board; and the mezzanine board comprises a connector coupled to a power connector of the PCB to electrically connect the battery to the storage controller circuitry.

11. The server system of claim 10, wherein:

the housing has a bottom face which is mounted to the PCB; and the bottom face of the housing has an aperture at the mezzanine board compartment and the connector of the mezzanine board couples with the power connector of the PCB through the aperture.

12. The server system of claim 1, wherein the battery is removable from the housing.

13. A storage controller device, comprising:

an open compute project (OCP) storage controller module, wherein the OCP storage controller module is a pluggable module installable within a server system and comprises:

a printed circuit board (PCB) having an OCP form factor and including an OCP edge connector formed in one edge of the PCB and a power connector mounted to a face of the OCP;

storage controller circuitry mounted to the face of the PCB; and an energy storage device mounted to the PCB, wherein the energy storage device comprises:

a housing;

a battery contained in the housing and electrically connected to the storage controller circuitry; and a mezzanine board comprising battery management circuitry and a connector coupled to the power connector, wherein:

the battery management circuitry is electrically connected to the battery and to the power connector;

the battery is configured to supply electrical power to the storage controller circuitry via the connector and the power connector; and the battery management circuitry is configured to control the supply of electrical power to the storage controller circuitry; and an adapter that is attachable to the OCP storage controller module, wherein the adapter is configured to, in an attached state of the adapter to the OCP storage controller module, enable installation of the storage controller device in a bay of a front drive cage of the server system.

14. The storage controller device of claim 13, wherein the energy storage device is removably mounted to the PCB.

15. The storage controller device of claim 13, wherein the battery is a lithium-ion cell battery or a lithium-ion hybrid capacitor.

16. The storage controller device of claim 13:

wherein the adapter comprises:

first engagement features configured to engage with edges of the PCB in the attached state of the adapter; and second engagement features configured to, in an installed state of the storage controller device in the bay, engage with complementary engagement features of the bay of the front drive cage;

wherein, in the attached state of the adapter and the installed state of the storage controller device, the first engagement features and the second engagement features align the OCP storage controller module relative to the front drive cage such that the OCP edge connector can blind mate with an OCP socket connector of the bay.

* * * * *